United States Patent [19]

Colliver et al.

[11] 3,896,543

[45] July 29, 1975

[54] SEMICONDUCTOR DEVICE ENCAPSULATION PACKAGES AND ARRANGEMENTS AND METHODS OF FORMING THE SAME

[75] Inventors: David John Colliver; Stephen Edwin Gibbs, both of Malvern, England

[73] Assignee: British Secretary of State for Defence, London, England

[22] Filed: July 23, 1973

[21] Appl. No.: 381,657

Related U.S. Application Data

[62] Division of Ser. No. 253,036, May 15, 1972, abandoned.

[52] U.S. Cl. ...................... 29/580; 29/590; 29/591; 65/33

[51] Int. Cl.² .......................................... B01J 17/00

[58] Field of Search .......... 29/580, 576 S, 591, 589, 29/590; 65/33

[56] References Cited

UNITED STATES PATENTS

| | | | |
|---|---|---|---|
| 2,920,971 | 1/1960 | Stookey | 65/33 |
| 3,163,513 | 12/1964 | Brown | 65/33 |
| 3,310,858 | 3/1967 | Johnston | 29/590 |
| 3,317,287 | 5/1967 | Caracciolo | 29/576 S |
| 3,482,419 | 12/1969 | Rogers | 29/576 S |

OTHER PUBLICATIONS

"Handbook of Glass Manufacture," 1960, Tooley, pages 192 – 199.

*Primary Examiner*—W. Tupman
*Attorney, Agent, or Firm*—Elliott I. Pollock

[57] ABSTRACT

A semiconductor device encapsulation package suitable for party encapsulating a semiconductor device having an operating frequency of at least 10 Gigahertz comprises a piece of conducting material and a layer of glass-ceramic material deposited on the surface of said piece of conducting material, said layer being selectively etched to provide a post of glass-ceramic material surrounded by a wall of glass-ceramic material, wherein the nearest distance between said post and said wall is large compared with the dimensions of said post. The package may be used to encapsulate a semiconductor device by locating the semiconductor device adjacent to the post, electrically connecting a region of the post remote from the piece of conducting material to a region of the semiconductor device remote from the piece of conducting material and locating a cap on the wall, the cap being electrically connected to the post.

5 Claims, 10 Drawing Figures

SEMICONDUCTOR DEVICE ENCAPSULATION PACKAGES AND ARRANGEMENTS AND METHODS OF FORMING THE SAME

This is a division of application Ser. No. 253,036, filed May 15, 1972, now abandoned.

BACKGROUND OF THE INVENTION

The present invention relates to semiconductor device encapsulation and semiconductor device encapsulation packages.

Semiconductor devices operating at microwave frequencies are conventionally encapsulated in ceramic and metal packages. These packages serve two main purposes. The first main purpose is to keep the devices sealed within an enclosure so that neither breakdown of the semiconductor devices nor other harmful effects can occur by contamination from the external atmosphere. The second main purpose is to allow electrical contact to be made to the semiconductor devices without subjecting the semiconductor devices to large mechanical stresses.

There is a problem concerned with these packages at high frequencies, for example frequencies in the order of or greater than 10 GHz. The physical dimensions of the packages and the electrical properties of the ceramic material become critical at such high frequencies and can lead to unwanted resonances affecting the semiconductor device performance.

SUMMARY OF THE INVENTION

According to the present invention there is provided a method of producing a package suitable for partly encapsulating a high frequency semiconductor device including the steps of forming a layer of glass-ceramic material on a piece of conducting material and selectively etching the layer to form a post of glass-ceramic material surrounded by a ring of glass-ceramic material, wherein the nearest distance between the post and the ring is large compared with the dimensions of the post.

According to another aspect of the present invention there is provided a package suitable for partly encapsulating a high frequency semiconductor device and produced by the above method.

Accordinng to another aspect of the present invention there is provided a method of encapsulating a high frequency semiconductor device including the steps of providing a package produced by the above method, locating the semiconductor device on the piece of conducting material adjacent to the post, electrically connecting a region of the post distant from the piece of conducting material to a region of the semiconductor device distant from the piece of conducting material and locating a cap on the ring so that an enclosure is formed by the cap, the ring and the piece of conducting material around the post, the semiconductor device and the electrical connection between them, wherein the cap contains an electrically conducting region electrically connected to the said region of the post distant from the piece of conducting material.

According to another aspect of the present invention there is provided an encapsulated semiconductor device whose encapsulation is produced by the above method of encapsulation.

The post of glass-ceramic material may be of circular, polygonal or any other suitable cross-section.

The ring may be of any convenient shape. For example, it may be a circular annulus or it may be a rectangular periphery.

A further semiconductor device or a plurality of further semiconductor devices may be placed on the piece of conducting material adjacent to the post and the semiconductor devices may then be connected together, for example in electrical series or in electrical parallel.

The method of producing a package suitable for encapsulating a high frequency semiconductor device may include the step of selectively etching the layer of glass-ceramic material to form a plurality of posts of glass-ceramic material surrounded by the ring of glass-ceramic material.

The method of encapsulating a semiconductor device may include the steps of providing a package containing a plurality of posts of glass-ceramic material and electrically connecting a region distant from the piece of conducting material on each post to a region distant from the piece of conducting material on one semiconductor device or on a plurality of semiconductor devices. The plurality of posts may be formed in a straight line and adjacent posts may be separated by a distance approximately an integral multiple of half the operating wavelength of the semiconductor devices.

BRIEF DESCRIPTION OF THE DRAWINGS

Embodiments of the present invention will be described by way of example with reference to the accompanying drawings, in which.

DESCRIPTION OF THE PREFERRED EMBODIMENTS

Figures 1, 2:
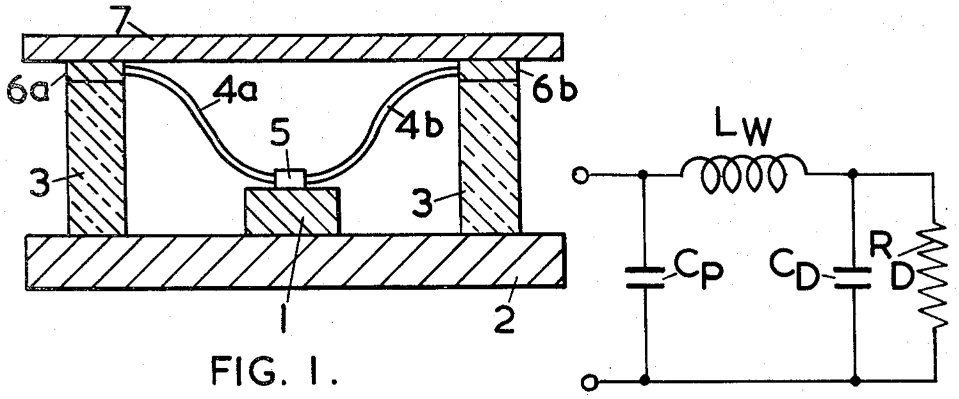
FIG. 1 is a cross-sectional diagram of a conventional semiconductor device encapsulation arrangement.
FIG. 2 is a circuit diagram of the equivalent circuit of the arrangement described with reference to FIG. 1.

FIG. 1 is a cross-sectional diagram of a conventional semiconductor device encapsulation arrangement consisting of a semiconductor device encapsulated in an encapsulation package. A semiconductor device 1, which may for instance be an active device such as a gallium arsenide Gunn effect or other transferred electron effect oscillator or an indium phosphide three level oscillator or a passive device such as a varactor or p-i-n diode, is deposited on a plate 2 made of conducting material such as copper. An annulus 3 of ceramic material, for example alumina, is deposited on the plate 2 so that the semiconductor device 1 is surrounded by the annulus 3. Connections 4*a* and 4*b*, which may be either wire or ribbon and which are made of gold, are made between the semiconductor device 1 and the top of the annulus 3. The connection 4*a* is attached to the semiconductor device 1 by means of a gold bond 5 and to the top of the annulus 3 by means of a gold bond 6*a*. The connection 4*b* is also attached to the semiconductor device 1 by means of the gold bond 5 and is attached to the top of the annulus 3 by means of a bond 6*b*. A top plate 7 made of conducting material such as copper is placed on top of the bond 6*a* and the bond 6*b* and attached to the top of the bond 6*a* and the bond 6*b*, for example by brazing, so that a sealed encapsulation package is formed around the semiconductor device 1. (The sealing is performed in an inert atmosphere).

Electrical voltages may then be applied across the semiconductor device 1 by applying them between the plate 7 and the plate 2.

The capacitor formed by the annulus 3 between the plate 5 and the plate 7 has a capacitance Cp. The connections 4*a* and 4*b* have a combined inductance Lw. At low frequencies the capacitance Cp and the inductance Lw supply lumped reactances (to a first approximation). At high frequencies the dimensions of the encapsulation package become critical. The magnitude of the capacitance Cp in Farads is given approximately by the following relationship:

$$Cp = 9 \times 10^{-12} \frac{KA}{2} \qquad \text{Equation 1}$$

where $A$ is the area in square metres of the top or base of the annulus 3,$l$ is the height in metres of the annulus 3 and $K$ is the permittivity of the ceramic material of the annulus 3. The magnitude of the inductance Lw in Henrys for a single connection 4*a* or 4*b* is given approximately by the relationship:

$$Lw = 2s \log_e \frac{2s}{r} - 1 \times 10^{-7} \qquad \text{Equation 2}$$

where $s$ is the length in metres of the connection 4*a* or 4*b* and $r$ is the radius in metres of the connection 4*a* or 4*b*. When the number $n$ of connections is greater than one, for example such as $n = 2$ in the package described above with reference to FIG. 1 which includes the connections 4*a* and 4*b*, Lw is decreased by a factor of about $1/n$.

FIG. 2 is a circuit diagram of the equivalent circuit (to a good approximation) of the encapsulation arrangement described with reference to FIG. 1. The semiconductor device 1 has a resistance $R_D$ in parallel with its own capacitance $C_D$. The inductance Lw is in series with the parallel combination of the capacitance $C_D$ and the resistance $R_D$, and the capacitance $C_p$ is in parallel with the series combination of the inductance Lw and the parallel combination of the capacitance $C_D$ and the resistance $R_D$. Series and parallel resonances of the circuit described with reference to FIG. 2 can occur in the frequency range of interest which consists of frequencies in the order of or greater than 10 GHz.

The frequency at which series resonance occurs and the frequency at which parallel resonance occurs can be removed from the frequency range of interest by reducing the inductance Lw and the capacitance Cp.

The inductance Lw can be reduced by carefully selecting the length s and radius $r$ of the connections 4a and 4b in accordance with Equation 2.

The capacitance Cp of the conventional package cannot be reduced by a very large amount in accordance with Equation 1 because conventional techniques do not allow the area A or the permittivity K to be reduced by large amounts or the length $l$ to be increased by a large amount when the semiconductor device 1 is required to operate at high frequencies.

A method of encapsulating a semiconductor device, which method is an embodiment of the present invention, will now be described with reference to FIG. 3, FIG. 4 and FIG. 5.

Figures 3, 4, 5:
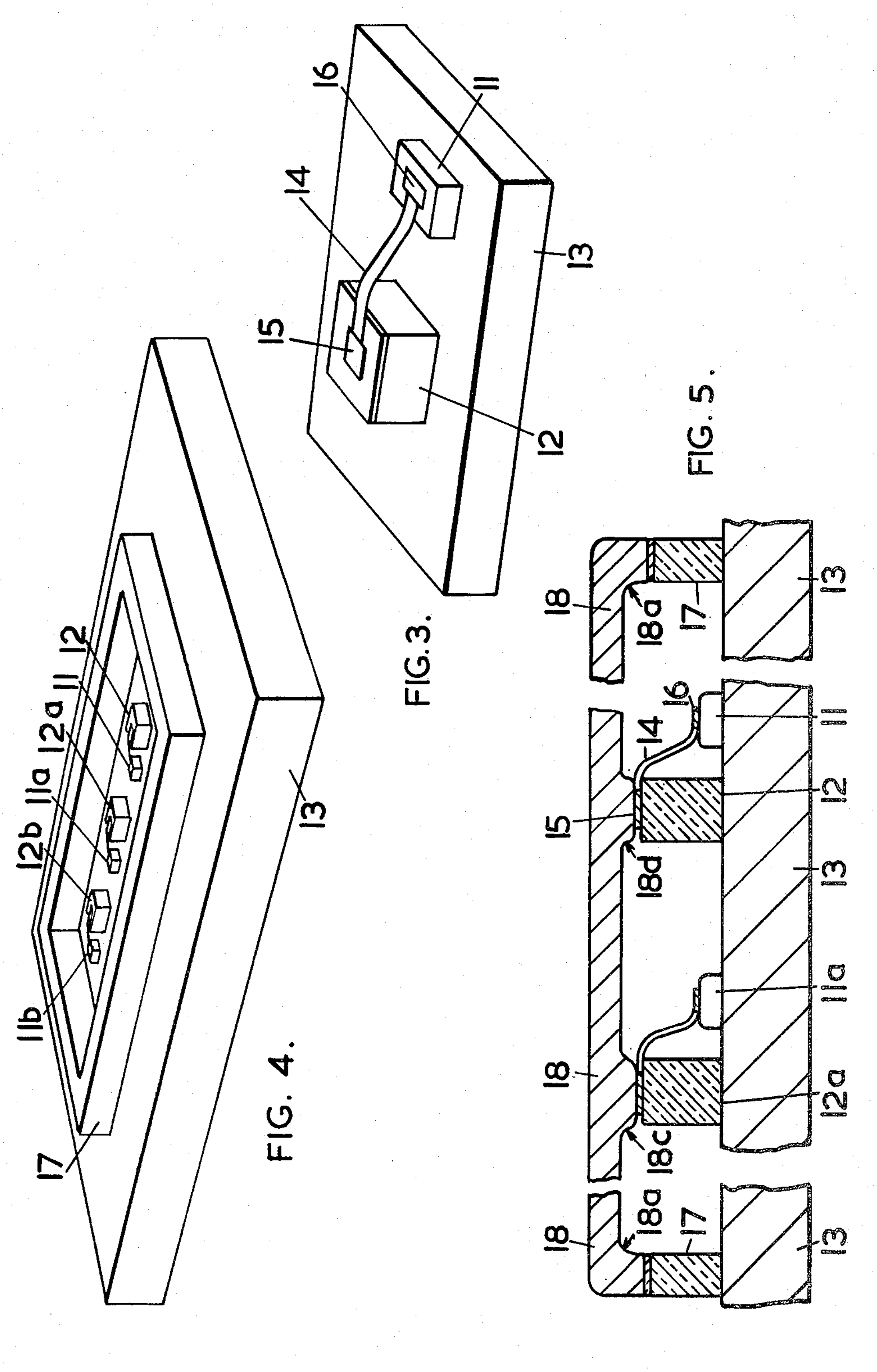
FIG. 3 is a perspective view of part of a semiconductor device part-encapsulation arrangement.
FIG. 4 is a perspective view of a practical semiconductor device part-encapsulation arrangement.
FIG. 5 is a cross-sectional diagram of part of a semiconductor device encapsulation arrangement.

FIG. 3 is a perspective view of part of a semiconductor device part-encapsulation arrangement consisting of a semiconductor device partly encapsulated in a package. A semiconductor device 11, which may for instance be a Gunn effect oscillator or a three level oscillator or an avalanche diode or a passive device such as a varactor or p-i-n diode, is electrically connected to a piece 12 of glass-ceramic material and deposited on a plate 13 of conducting material, for example copper or diamond or copper on diamond. A connection 14, which may be made of gold wire or ribbon, is bonded to a bond 15, which may be made of gold, on top of the piece 12 of glass-ceramic material and to a bond 16, which may be made of gold, on top of the semiconductor device 11.

One reason for making the piece 12 of glass-ceramic material, instead of the ceramic material conventionally used in the encapsulation of semiconductor devices, is that glass-ceramic has in general a lower permittivity than that of the ceramic conventionally used. The piece 12 of glass-ceramic material is in the form of a post at one side of the semiconductor device 11 rather than in the form of an annulus closely surrounding the semiconductor device 11. By using the piece 12 in the form of a post rather than in the form of an annulus the surface area of the top of the piece 12 may be minimized. The piece 12 of glass-ceremic material is shown in FIG. 3 in a form having a rectangular cross-section but the piece 12 may be of circular or any other convenient form of cross-section. Typically the piece 12 would have dimensions in the order of or less than about $2.5 \times 10^{-4}$ metres for high frequency operation. (This means that if the piece 12 is cubic its sides would be typically about $2.5 \times 10^{-4}$ metres or less and if the piece 12 is circular its height would be typically about $2.5 \times 10^{-4}$ metres or less and its diameter would be typically about $2.5 \times 10^{-4}$ metres). Electrical contact may be made to the bond 15 by a convention 1 contacting probe (not shown) and the mechanical stresses produced by such contact do not effect the semiconductor device 11. The plate 13 acts as a heat sink and as an electrical contact to the semiconductor device 11 in a manner similar to that in which base plates of conventional encapsulation packages act. Electrical voltages may be applied between the plate 13 and the bond 15 via its contacting probe.

FIG. 4 is a perspective view of a practical semiconductor device part-encapsulation arrangement. A ring 17 made of glass-ceramic material is in practice formed at the same time as the glass-ceramic material of the piece 12 of glass-ceramic material (as described below). The ring 17 is deposited around the semiconductor device 11. (The semiconductor device 11 is electrically connected to the piece 12 as described with reference to FIG. 3). The ring 17 may be rectangular (that is similar in shape to a picture frame) or it may be in the form of a circular annulus or any other suitable shape. The ring 17 is formed relatively far away from the semiconductor device 11 in order to minimize the effect of the capacitance of the ring 17 at the semiconductor device 11. The nearest distance from the semiconductor device 11 (and also the piece 12 of glass-ceramic material) to the ring 17 needs to be in the order of or greater than $\lambda g/2$, where $\lambda g$ is the wavelength of operation of the semiconductor device 11. In practice the minimum nearest distance between the ring 17 and the semiconductor device 11 would be in the range of about 15 mm for a semiconductor device having a frequency of 10 GHz to about 1.5 mm or less, for a semiconductor device having a frequency of 100 GHz or greater (i.e. generally of the order of 5 mm.) The height of the ring 17 is made the same as the height of the piece 12 and the thickness of the ring 17 is about the same size as the height.

If the plate 13 and the ring 17 are sufficiently large it is possible for semiconductor devices additional to the semiconductor device 11 to be contained within the ring 17. FIG. 4 shows a further semiconductor device 11*a* electrically connected to a piece 12*a* of glass-ceramic material in the manner described above with reference to FIG. 3, and a still further semiconductor device 11*b* electrically connected to a piece 12*b* of glass-ceramic material in the manner described above with reference to FIG. 3. The semiconductor devices 11*a* and 11*b* are also at a distance in the order of or greater than $\lambda g/2$ from the ring 17. (The piece 12*a* of glass-ceramic material and the piece 12*b* of glass-ceramic material are in practice formed at the same time as the piece 12 of glass-ceramic material and the ring 17 as described below).

FIG. 5 is a cross-sectional diagram of part of a semiconductor device encapsulation arrangement. The arrangement consists of the semiconductor device 11 and its encapsulation package and is obtained after a further step in the encapsulation of the semiconductor device 11 (described with reference to FIG. 3 and FIG. 4). A plate 18 of conducting material, such as copper, is deposited on top of the ring 17, the piece 12 of glass-ceramic material, the piece 12*a* of glass-ceramic material and the piece 12*b* of glass-ceramic material. The plate 18 is made with a rim 18*a* which makes contact with the ring 17 and mesas 18*b*, 18*c* and 18*d* (18*b* not shown) which make contact with the top of the piece 12*b*, the top of the piece 12*a* and the top of the piece 12 respectively. The plate 18 may be attached to the top of the ring 17, to the top of the piece 12, to the top of the piece 12*a* and to the top of the piece 12*b* by by brazing or any other conventional bonding technique. The plate 18 serves to provide a hermetic seal to the arrangement described with reference to FIG. 4.

Voltages may be applied across the semiconductor device 11 by applying them between the plate 18 and the plate 13.

Alternatively, the plate 18 may contain insulating regions (not shown) electrically isolating the means 18*b*, 18*c*, 18*d* and the rim 18*a* so that different voltages may be separately applied across each of the semiconductor devices 11, 11*a* and 11*b*.

Encapsulation of devices (for example high frequency transistors) having more than two electrodes may be achieved in this way. A further separate piece of glass ceramic material (similar to the piece 12) is deposited on the plate 13 for each further electrode of each semiconductor device, and the plate 18 contains a corresponding further separate electrically isolated Mesa opposite each further piece of glass-ceramic material. An electrical connection (which again may be gold wire or ribbon) is then taken from each mesa to a bond at the appropriate part (the further electrode) of each semiconductor device.

The ring 17, the piece 11, the piece 11*a* and the piece 11*b* are formed in a single operation by depositing a single layer of glass-ceramic on the plate 13 and selectively etching areas of the layer in a manner described below.

Glass-ceramics are well known. They consist of a polycrystalline solid prepared by the controlled heat treatment of a glass. They can take many forms of composition and are usually made from oxides. One particular known composition which is suitable for use in embodiments of the present invention consists of approximately 60 atomic per cent silicon dioxide $SiO_2$, 25 atomic per cent zinc oxide ZnO, 10 atomic per cent lithium oxide $Li_2O$, 2.5 atomic per cent phosphorus pentoxide $P_2O_5$ and 2.5 atomic per cent of one or more of the following:

$K_2O$, $Na_2O$, $B_2O_3$, MgO, CaO, BaO, PbO, and $Al_2O_3$.

The precentages given may be varied to provide a few atomic per cent more or a few atomic per cent less of one or more of the stated constitutents as appropriate.

A glass layer may be formed on a copper plate by any known technique. For example, a glass powder of the appropriate composition may be sprayed on a conventional organic fixative layer contained on the surface of the plate 13. (The fixative layer is then removed later during heat treatment). Alternatively, a paste containing a glass powder of the appropriate composition embedded in a conventional organic binder may be applied to the plate 13 by a conventional silk screen process. Alternatively, a thin layer of molten glass may be deposited on the plate 13 and this then may be etched, for example using hydrofluoric acid, to the appropriate layer thickness. Any powdered glass used may be converted to a single glass layer first by heating in air at a temperature of about 500°C to remove any organic constituents and then by heating in an inert atmosphere at a temperature of about 1000°C. A platinumlined furnace may be used for this purpose. The glass is converted to glass-ceramic by the conventional method. This involves heating the glass to its nucleation temperature, the temperature at which crystal nucleation begins and which may be determined previously by experiment, maintaining the glass at its nucleation temperature for about an hour in order to permit nucleation, raising the temperature from the nucleation temperature in order to permit crystallization at a rate of about 50C° per minute until the maximum crystallization temperature, which is also determined previously by experiment, is reached, maintaining the glass at its maximum crystallization temperature for about an hour and then cooling back to room temperature at a rate of about 10C° per minute.

The layer of glass-ceramic formed on the plate 13 in the manner described above is then selectively etched. The selective etching may be performed by any conventional selective etching technique such as any of the techniques used in planar integrated circuit production. Such conventional techniques consist for example of covering the surface to be etched with photoresist material, placing a mask on top of the photoresist material in order to define the regions required to be left after etching, exposing the unmasked areas to ultraviolet radiation or an electron beam so that the exposed areas are rendered insoluble and the unexposed areas are left soluble in a particular solvent or so that the exposed areas are rendered soluble and the unexposed areas are left insoluble in a particular solvent, dissolving the soluble areas, etching through the apertures so produced and removing the rest of the photoresist material after etching. A suitable etchant for use in the method embodying the present invention is hydrofluoric acid possibly mixed with one or more of the other strong common acids. (This etchant is also used as a conventional etchant in integrated circuit production).

Figure 6:
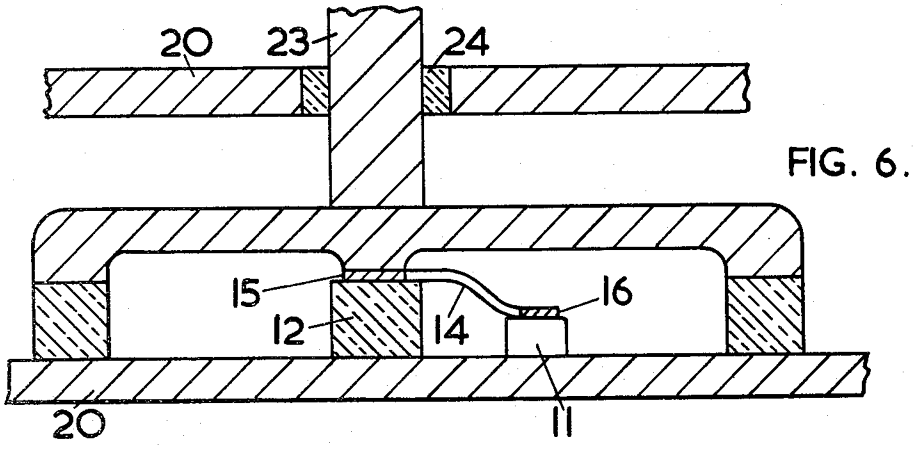
FIG. 6 is a cross-sectional diagram of a semiconductor device encapsulation arrangement.

FIG. 6 is a cross-sectional diagram of a semiconductor device encapsulation arrangement produced by an alternative encapsulation method. In this case the semiconductor device 11 electrically connected to the top of the piece 12 of glass-ceramic material in the manner described above with reference to FIG. 3 is deposited inside a piece 20 of waveguide instead of on the plate 13. Electrical connection is made to the bond 15 by means of a conventional probe 23 entering the piece 20 of waveguide via an insulator ring 24. The encapsulation of the semiconductor device 11 is completed by the ring 17 and the plate 18. The probe 23 is electrically connected to the plate 18. Electrical voltages may then be applied between the probe 23 and the piece 20 of waveguide. The distance between the semiconductor device 11 and the ring 17 of glass-ceramic material or the insulator ring 24, is greater than $\lambda g/2$ (where $\lambda g$ refers to the wavelength within the piece 20 of waveguide). The piece 12 of glass-ceramic material (and the semiconductor device 11) may be deposited on a thin piece of conducting material (not shown), for example copper, which is then attached to the inside of the piece 20 of waveguide for example by screwing the piece 20 of waveguide and the piece of conducting material together in a conventional manner. Alternatively, the piece 12 of glass-ceramic material (and the semiconductor device 11) may be formed on a plate of conducting material and the rest of the piece 20 of waveguide may than be built around the plate. Further semiconductor devices attached to their respective pieces of glass-ceramic material may be added within the piece 20 of waveguide.

Figure 7:
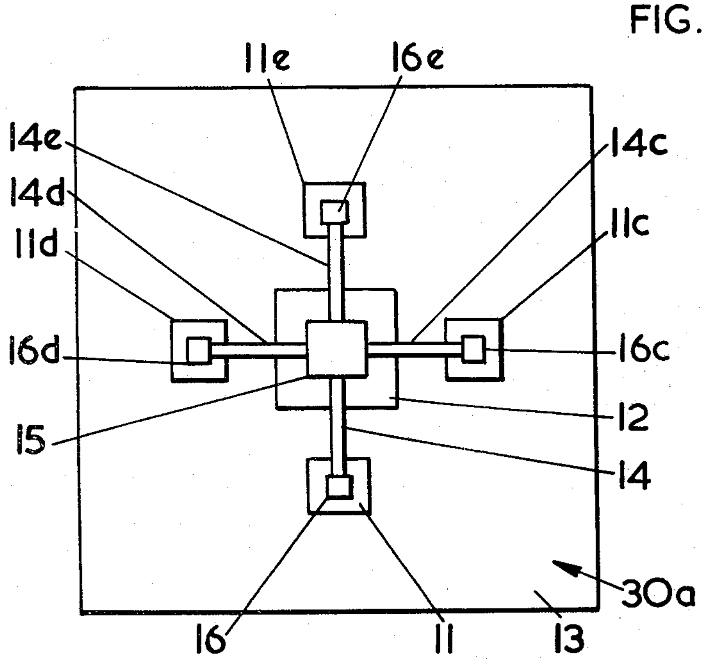
FIG. 7 is a plan view of a semiconductor device part-encapsulation arrangement.

FIG. 7 is a plan diagram of a semiconductor device part-encapsulation arrangement. The arrangement, consisting of a plurality of semiconductor devices and part of their encapsulation package is a modification of that described above with reference to FIG. 3. In addition to the semiconductor device 11, deposited on the plate 13 and electrically connected to the top of the piece 12 of glass-ceramic material by means of the connection 14 attached to the bond 15 and the bond 16, there are three further semiconductors devices 11*c*, 11*d* and 11*e* deposited on the plate 13 and around the piece 12 of glass-ceramic material so that a structure 30*a* is formed. Electrical connection is made between the semiconductor device 11*c* and the top of the piece 12 of glass-ceramic material by means of a connection 14*c* bonded to the semiconductor device 11*c* by means of a bond 16*c* on top of the semiconductor device 11*c* and bonded to the top of the piece 12 of glass-ceramic material by means of the bond 15. Electrical connection is made between the semiconductor device 11 *d* and the top of the piece 12 of glass-ceramic material by means of a connection 14*d* bonded to the semiconductor device 11*d* by means of a bond 16*d* on top of the semiconductor device 11*d* and bonded to the top of the piece 12 of glass-ceramic material by means of the bond 15. Electrical connection is made between the semiconductor device 11*e* and the top of the piece 12 of glass-ceramic material by means of a connection 14*e* bonded to the semiconductor device 11*e* by means of a bond 16*e* on top of the semiconductor device 11*e* and bonded to the top of the piece 12 of glass-ceramic material by means of the bond 15. The semiconductor devices 11, 11*c*, 11*d* and 11*e* may thus be operated in parallel while using a single piece of glass-ceramic material (the piece 12 of glass-ceramic material) for making electrical connections. The amount of parasitic capacitance per semiconductor device may be reduced and the packing density may be increased by this arrangement. The encapsulation may be completed in the manner described above with reference to FIG. 4 and FIG. 5.

Figure 8:
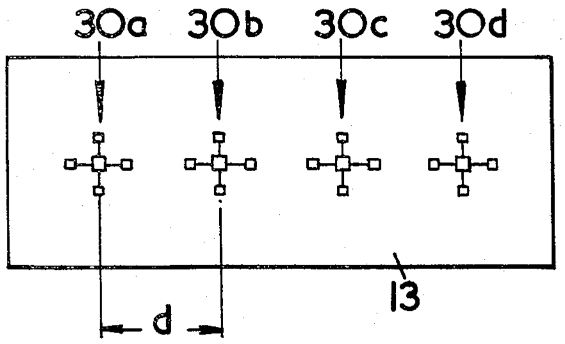
FIG. 8 is a plan view of a semiconductor device part-encapsulation arrangement.

FIG. 8 is a plan diagram of a semiconductor device part-encapsulation arrangement. The arrangement is a modification of the arrangement described above with reference to FIG. 7. In this case in addition to the structure 30*a* a further structure 30*b*, a further structure 30*c* and a further structure 30*d* are deposited on the plate 13. The structures 30*b*, 30*c* and 30*d* are each identical with the structure 30*a*. The structures 30*a*, 30*b*, 30*c* and 30*d* are deposited at intervals along a straight line. The structure 30*a* and the structure 30*b* are separated by a distance *d*, the structure 30*b* and the structure 30*c* are separated by the distance *d* and the structure 30*c* and the structure 30*d* are separated by the distance *d*. The distance *d* may be equal to $\alpha\lambda g/2$, where $\alpha$ is equal or approximately equal to an integer, in which case the arrangement resembles a travelling wave tube in that an electromagnetic wave beginning at the semiconductor devices of one of the structures 30*a*, 30*b*, 30*c*, 30*d* will be reinforced by an electromagnetic wave beginning at the semiconductor devices of the next of the structures 30*a*, 30*b*, 30*c*, 30*d* along the line. The encapsulation of the arrangement is completed in the manner described above with reference to FIG. 4 and FIG. 5.

Figure 9:
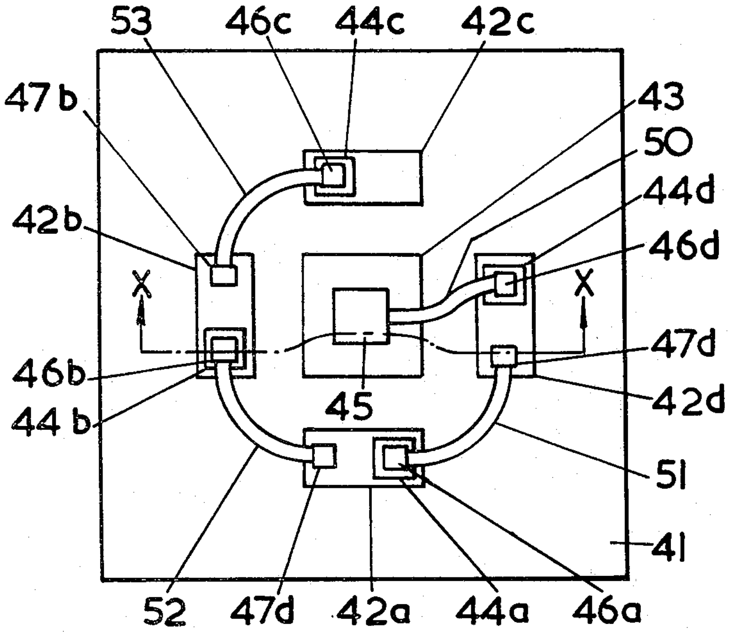
FIG. 9 is a plan view of a semiconductor device part-encapsulation arrangement.
Figure 10:
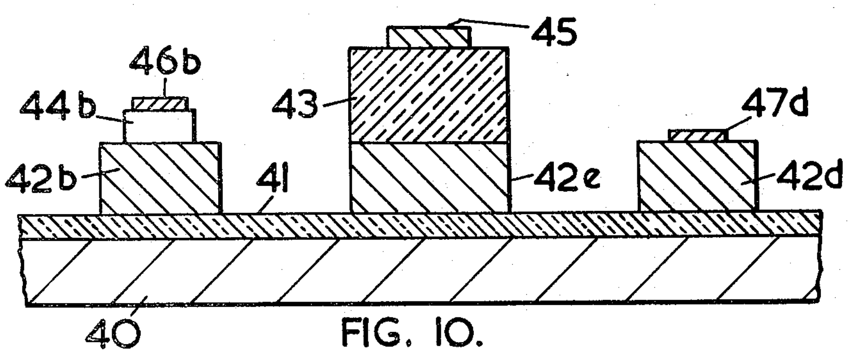
FIG. 10 is a cross-sectionaal diagram on the line X—X of the arrangement described with reference to FIG. 9.

FIG. 9 is a plan view of a semiconductor device part-encapsulation arrangement and FIG. 10 is a cross-section diagram on the line X—X of FIG. 9. A large plate 40 of conducting material, for example copper, is coated with a thin layer 41 of glass-ceramic material. A small plate 42*a*, a small plate 42*b*, a small plate 42*c*, a small plate 42*d* and a small plate 42*e* are formed on the layer 41 for example by depositing a single layer of copper or other conducting material and selectively etching to form the plates 42*a*, 42*b*, 42*c*, 42*d* and 42*e*. A piece 43 of glass-ceramic material formed by selectively etching a layer of glass-ceramic material in the manner described above, is formed on top of the plate 42*e*. A semiconductor device 44*a* is deposited on the top surface of the plate 42*a*, a semiconductor device 44*b* is deposited on the top surface of the plate 42*b*, a semiconductor device 44*c* is deposited on the top surface of the plate 42*c* and a semiconductor device 44*d* is deposited on the top surface of the plate 42*d*. The semiconductor device 44*d* is electrically connected to the top of the piece 43 of glass-ceramic material by means of a connection 50, which may be made of gold ribbon or wire, bonded to the top of the piece 43 of glass-ceramic material by means of a bond 45, which may be made of gold, on top of the piece 43 of glass-ceramic material and bonded to the semiconductor device 44*d* by means of a bond 46*d*, which may be made of gold, on top of the semiconductor device 44*d*. A connection 51, which may be made of gold, is made between a bond 47*d* on the top surface of the plate 42*d* and a bond 46*a* on top of the semiconductor device 44*a*. A connection 52, which may be made of gold, is made between a bond 47*a* on the top surface of the plate 42*a* and a bond 46*b* on the top surface of the semiconductor device 44*b*. A connection 53, which may be made of gold, is made between a bond 47*b* on the top surface of the plate 42*b* and a bond 46*c* on the top surface of the semiconductor device 44*c*.

In this arrangement the semiconductor devices 44*a*, 44*b*, 44*c* and 44*d* are all connected in electrical series. This arrangement may be contrasted with that described above with reference to FIG. 7 in which the semiconductor devices 11, 11*c*, 11*d* and 11*e* are connected in electrical parallel.

The arrangement described with reference to FIG. 9 and FIG. 10 may be modified to form a travelling wave structure in a manner similar to that described above with reference to FIG. 8.

The encapsulation of the arrangement described with reference to FIG. 9 and FIG. 10 may be completed in the manner described above with reference to FIG. 4 and FIG. 5.

We claim:

1. A method of encapsulating a high frequency semiconductor device comprising the steps of (*a*) depositing on a piece of conducting material a glass of a kind which is convertible by controlled heat treatment to form a glass-ceramic, (*b*) converting said glass into a glass-ceramic layer of uniform thickness by a controlled heat treatment thereof which comprises heating said glass to the nucleation temperature at which crystal nucleation thereof begins, maintaining said glass at said nucleation temperature for a period of time, heating said glass further to the maximum temperature at which crystallization thereof occurs, maintaining said glass at said maximum crystallization temperature for a period of time, and slowly cooling said glass to produce said glass-ceramic layer consisting of a two-phase medium of a uniformly distributed ceramic mass embedded within a glass binding medium, (*c*) depositing a layer of resist material on said glass-ceramic layer, (*d*) depositing a mask on said layer of resist material, (*e*) changing the solubility of parts of said layer of resist material by exposing said layer of resist material to a solubilitychanging radiation through said mask, (*f*) dissolving away the soluble regions of said resist, (*g*) chemically etching said layer of glass-ceramic through said dissolved away regions to form a plurality of glass-ceramic posts on said piece of conducting material, (*h*) mounting at least one semiconductor device on said conducting material at positions adjacent each of said posts, and (*i*) electrically connecting the parts of said semiconductor devices remote from said conducting material to said posts.

2. The method of encapsulating as claimed in claim 1 wherein the two periods of time recited in controlled heat treatment step (*b*) are each in the order of 1 hour.

3. The method of encapsulation as claimed in claim 1 including the step of electrically connecting said semiconductor devices to one another in electrical series.

4. The method of encapsulation as claimed in claim 21 including the step of electrically connecting said semiconductor devices to one another in electrical parallel.

5. The method of encapsulation as claimed in claim 1 wherein said steps (*c*) through (*g*) inclusive are so conducted as to leave also a glass-ceramic wall around said posts, said step of mounting each said at least one semiconductor device comprising mounting each said at least one device on said piece of conducting material within said wall.

* * * * *